US007034375B2

(12) United States Patent
Kang

(10) Patent No.: US 7,034,375 B2
(45) Date of Patent: Apr. 25, 2006

(54) MICRO ELECTROMECHANICAL SYSTEMS THERMAL SWITCH

(75) Inventor: Joon-Won Kang, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/371,572

(22) Filed: Feb. 21, 2003

(65) Prior Publication Data

US 2004/0164371 A1 Aug. 26, 2004

(51) Int. Cl.
*H01L 31/058* (2006.01)

(52) U.S. Cl. ....................................... 257/467; 257/254

(58) Field of Classification Search ................ 257/472, 257/473, 451, 254, 467

See application file for complete search history.

(56) References Cited

U.S. PATENT DOCUMENTS 3,896,309 A 7/1975 Halsor et al.
5,463,233 A * 10/1995 Norling ...................... 257/254
5,796,152 A 8/1998 Carr et al.
2003/0034870 A1* 2/2003 Becka et al. .................. 337/36

OTHER PUBLICATIONS

Ionesca, A.M. et al., Modeling and Design of a Low-Voltage SOI Supended-Gate MOSFET (SG-MOSFET) with a Megal-Over-Gate Architecture, International Symposium on Quality Electronic Design, Mar. 18, 2002, pp. 496-501, Los Alamitos, CA.

Fritschi R. et al., A Novel RF MEMS Technological Platform, Annual Conference of the IEEE Industrial Electronics Society, Nov. 5, 2002, pp. 3052-3056, New York, NY.

* cited by examiner

*Primary Examiner*—Edward Wojciechowicz
(74) *Attorney, Agent, or Firm*—Black Lowe & Graham PLLC

(57) ABSTRACT

A Micro Electro-Mechanical Systems (MEMS) thermal switch. The switch includes a FET having a source and drain in a substrate and a beam isolated from the substrate. The beam is positioned over the source and the drain and spaced by a predefined gap. When the thermal set point is reached, the beam moves to electrically connect the source to the drain.

10 Claims, 5 Drawing Sheets

MICRO ELECTROMECHANICAL SYSTEMS THERMAL SWITCH

BACKGROUND OF THE INVENTION

Conventional thermal switches use bi or trimetallic disks for performing the switching process. These thermal switches include a metal-to-metal contact that results in microwelding, arching, and oxidization that can cause the switch to prematurely fail. Also, these thermal switches cannot be reduced below a certain size limit and thus, have limited applicability. Also, these thermal switches include a number of parts that require costly manual construction. The set point of these thermal switches is determined by the material and geometry of the thermal disk used and cannot be adjusted after construction. Therefore, these thermal switch set points cannot be adjusted once the switch is fabricated.

Therefore, there exists a need for an easy-to-produce thermal switch with an adjustable set point that can be efficiently manufactured.

SUMMARY OF THE INVENTION

The present invention provides a Micro Electro-Mechanical Systems (MEMS) thermal switch. The switch includes a FET having a source and drain in a substrate and a beam isolated from the substrate. The beam is positioned over the source and the drain and spaced by a predefined gap. When the thermal set point is reached, the beam moves to electrically connect the source to the drain.

In one aspect of the invention, a voltage source applies a voltage potential to the beam. The voltage source is adjusted in order to attain an electrostatic force between the beam and the substrate, thereby adjusting one or more of a thermal set point for the switch or hysterisis of the switch.

In another aspect of the invention, the beam is a bimetallic beam and the beam is arched concave or convex relative the source and the drain.

In still another aspect of the invention, the beam is a bimetallic h-beam.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

Figure 1A:
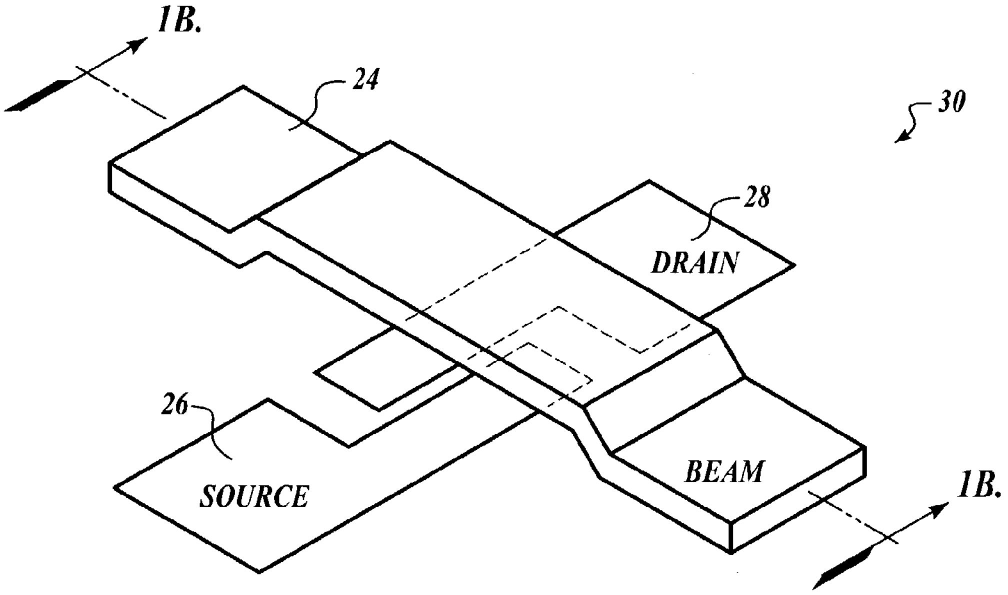
FIG. 1A illustrates a perspective view of a single beam embodiment of the present invention.
Figure 1B:
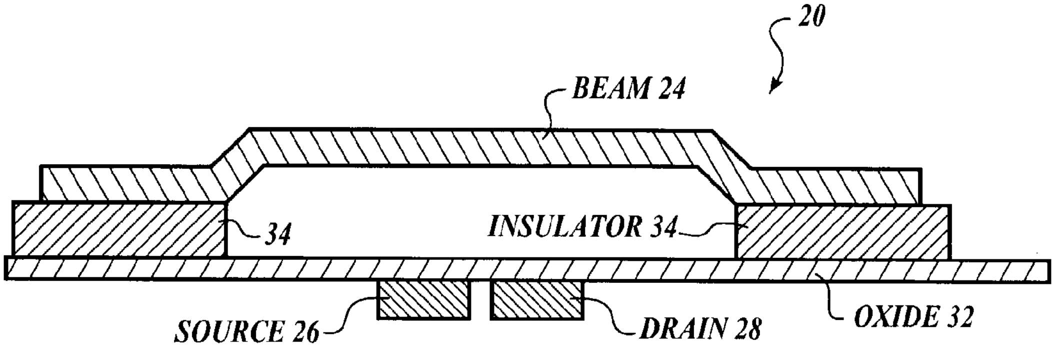
FIG. 1B illustrates a cross-sectional view of the single beam thermal switch of FIG. 1A.

The present invention is a Micro Electro-Mechanical Systems (MEMS) thermal switch with electrostatic control. FIG. 1A illustrates a perspective view of a single beam MEMS thermal switch 20. The thermal switch 20 includes a bimetallic beam 24 that is arched over a source 26 and a drain 28 that are created within a silicon substrate 30. FIG. 1B illustrates a cross-sectional view of the thermal switch 20 along a longitudinal axis of the beam 24. The source 26 and drain 28 are embedded within silicon substrate 30. The silicon substrate 30 is suitably a silicon wafer. Layered on top of the source 26 and the drain 28 is a gate oxide layer 32. The beam 24 is attached at its ends to insulator mounts 34. The insulator mounts 34 are attached to the gate oxide layer 32 on opposite sides of the source 26 and the drain 28 in order to allow the beam 24 to arch over the source 26 and the drain 28. The beam 24 is suitably a bimetallic beam that includes a first metal on one side of the beam 24 and a second metal on the other side of the beam 24. The first and second metals have different thermal expansion rates, thereby causing motion of the beam 24 in a direction towards the source 26 and drain 28 at a predefined temperature. The predefined temperature that causes the motion is called the set point of the thermal switch 20. When the set point is reached, the beam 24 flexes to make contact with the source 26 and drain 28, thereby electrically connecting the source 26 and the drain 28 and turning the switch 20 on.

Figure 2:
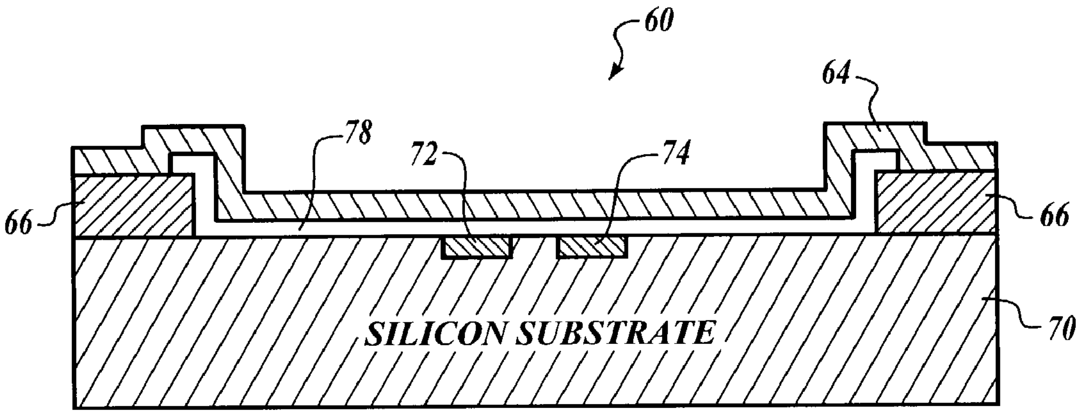
FIG. 2 illustrates a cross-sectional view of a second embodiment of a single beam thermal switch.

FIG. 2 illustrates another single beam thermal switch 60. The switch 60 includes a beam 64 mounted to insulator mounts 66. The insulator mounts 66 are oxide or any other insulating material. The insulator mounts 66 are mounted to a silicon substrate 70. A source 72 and a drain 74 are imbedded adjacent to each other within the substrate 70. The beam 64 is convex relative to the source 72 and the drain 74. A gap 78 exists between the beam 64 and the source 72 and the drain 74. As the temperature around the switch 60 increases, the beam 64 tries to expand but cannot because of the connection to the silicon substrate 70. Thus, the beam 64 flexes to make contact with the source 72 and the drain 74, thereby turning the switch 60 on. Not shown is a small layer of gate oxide that covers the source 104 and the drain 105. The gate oxide acts as an insulator and prevents an electrical short between the beam 64 and the substrate 70.

Figure 3:
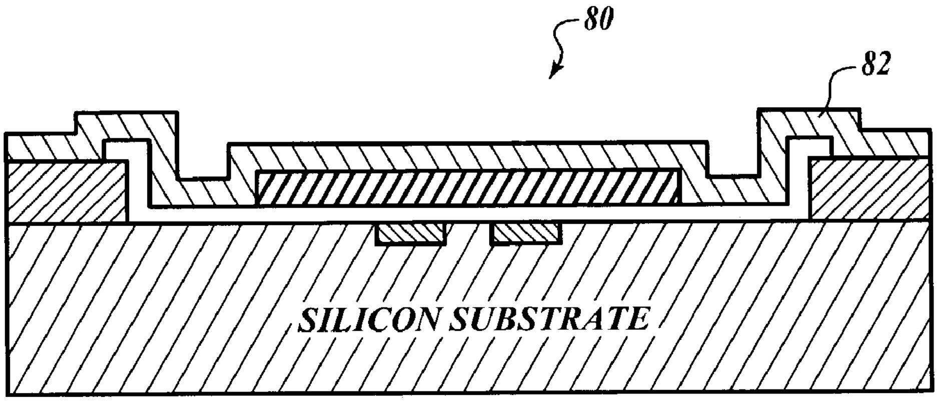
FIG. 3 illustrates a single bimetallic beam thermal switch formed in accordance with the present invention.

FIG. 3 illustrates a switch 80 similar in construction to the switch 60, however, the switch 80 includes a beam 82 that is a bimetallic beam. The bimetallic beam 82 of the switch 80 allows for more aggressive motion towards or away from the source and drain embedded within the substrate than motion of the beam 64 of the switch 60. Not shown is a small layer of oxide that covers the source and drain.

Figure 4A:
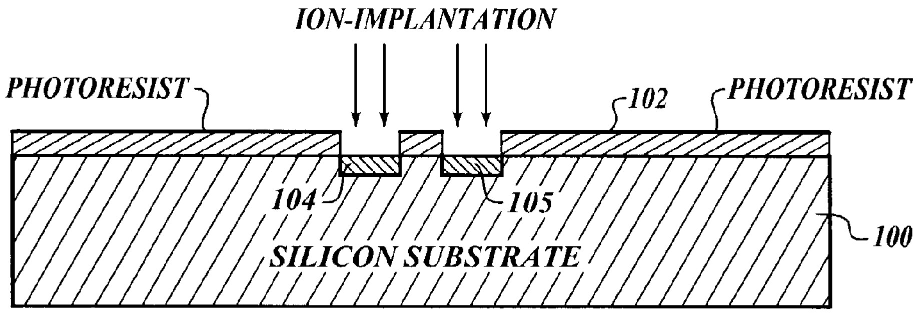
FIGS. 4A–F illustrate an example process of fabricating the thermal switch shown in FIG. 3.

FIGS. 4A–F illustrate the fabrication steps for creating the switch 80. As shown in FIG. 4A, a silicon substrate 100 or a single crystal silicon wafer is provided with P-type doping (e.g., Boron). It can be appreciated that the silicon substrate can be N-type doped. A photoresist layer 102 is applied to the silicon substrate and is then etched according to a mask for a source 104 and drain 105. Next, ion implantation occurs through the etched out portions of the photoresist 102 into the substrate 100 using an N-type matter, such as phosphorous. It can be appreciated that if the silicon wafer was N-type, the implantation would be with P-type matter. The photoresist layer 102 is then removed.

Figure 4B:
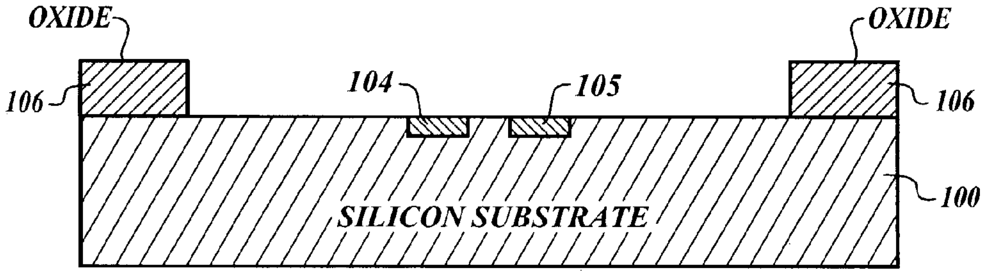

As shown in FIG. 4B, an oxide layer is applied to the silicon substrate 100 and etched according to a predefined mask. The predefined mask allows removal of oxide in order to create insulating mounts 106 for the mounting of a beam. Not shown is a small layer of gate oxide that covers the source 104 and drain 105. The small layer of gate oxide is grown after the creation of the insulating mounts 106.

Figure 4C:
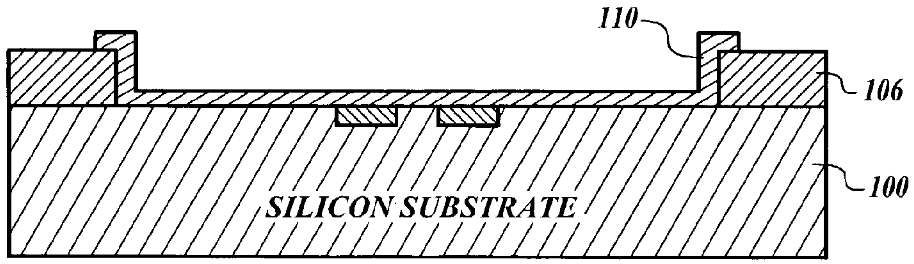

As shown in FIG. 4C, a sacrificial material layer 110 is applied over the insulating posts 106 and the silicon substrate 100. The sacrificial material layer 110 is then etched according to a predefined mask in order to define a gap that is to exist between a beam and the source 104 (not shown) and drain 105 (not shown). A non-limiting example of the sacrificial material used in the sacrificial material layer 110 is titanium or any other material that can be removed without removing other material.

Figure 4D:
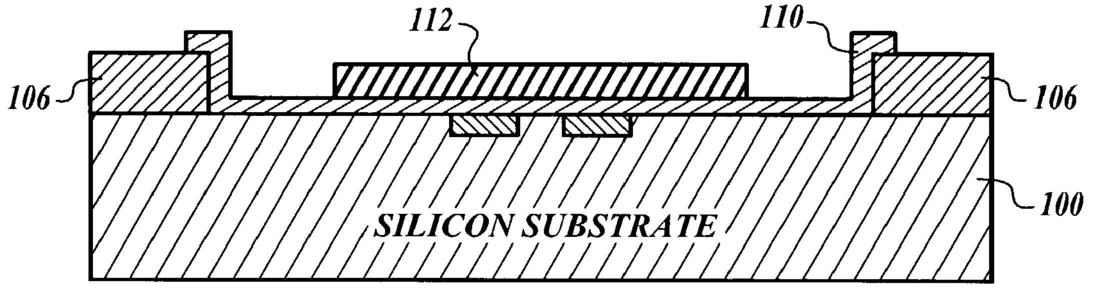

As shown in FIG. 4D, a first beam layer 112 is applied, masked, and etched on top of the sacrificial material layer 110. The first beam layer 112 can be aluminum, oxide, nitride, polysilicon, tungsten or any of a number of other materials.

Figure 4E:
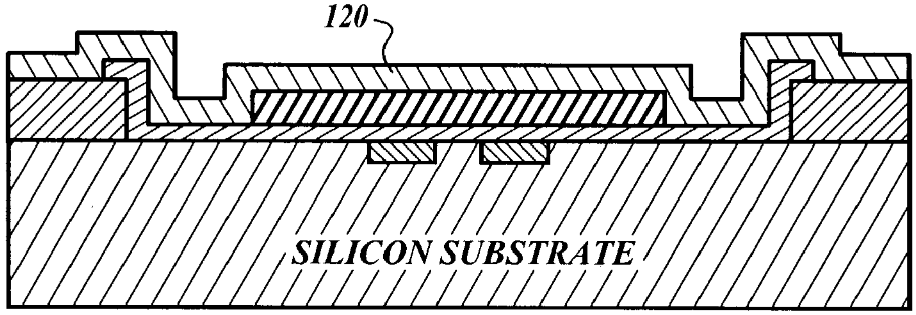

Next, as shown in FIG. 4E, a second beam layer 120 is applied over the insulating mounts 106, the sacrificial layer 110, and the first beam layer 112. The second beam layer 120 is etched according to a predefined mask. The second beam layer 120 can be chromium, polysilicon, or another material that has a coefficient of expansion different than the first beam layer 112.

Figure 4F:
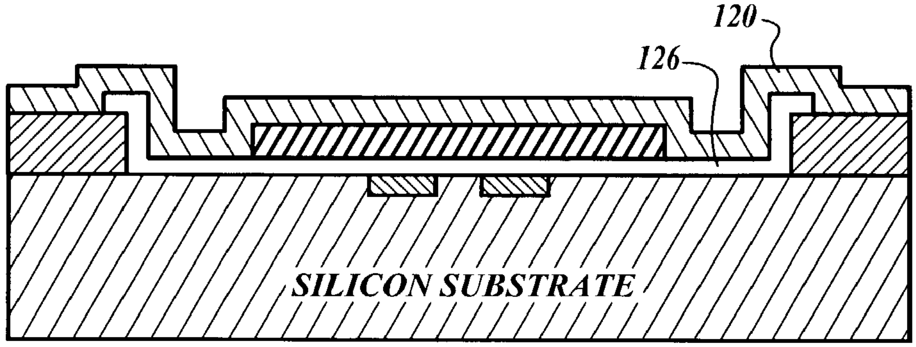

Finally, at FIG. 4F, the sacrificial material layer 110 is removed, thereby creating a gap 126 between the beam that includes beam layers 112 and 120 and the source 104 (not shown) and drain 105 (not shown).

Figure 5:
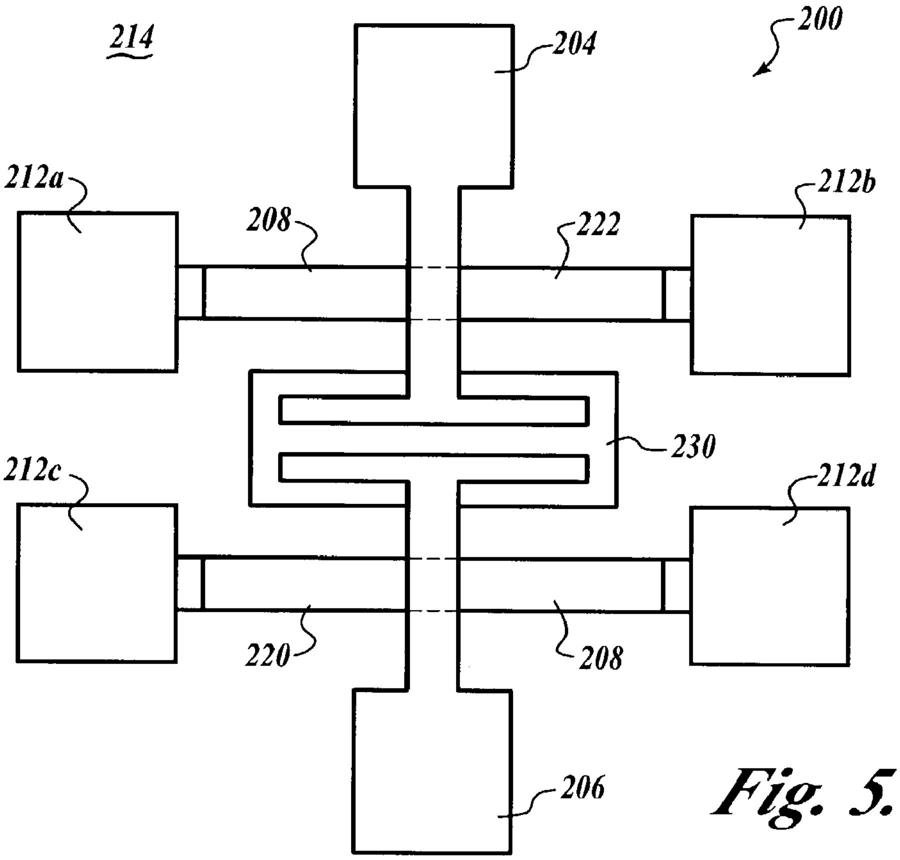
FIG. 5 illustrates an H-beam thermal switch formed in accordance with the present invention.

FIG. 5 illustrates a top view of an H-beam thermal switch 200. The H-beam thermal switch 200 includes a source 204, a drain 206 and an H-beam 208. The H-beam 208 includes four mounting pads 212 and that mount to insulating pads (not shown) that attach to a silicon substrate 214. The source 204 and the drain 206 are embedded within the silicon substrate 214. The H-beam 208 includes two parallel beams 220 and 222. The first beam 220 connects to securing pads 212*a* and 212*b* and connects to the second beam 222 securing pads 212*c* and 212*d*. A cross-beam 230 connects the beams 220 and 222 to each other at approximately their mid-points. The cross-beam 230 is preferably sized larger than ends of each of the source 204 and drain 206. When the thermal switch 200 has reached its set point, the H-beam 208 flexes causing the cross-beam 230 to come in contact with portions of the source 204 and the drain 206, thereby closing the circuit.

Figure 6:
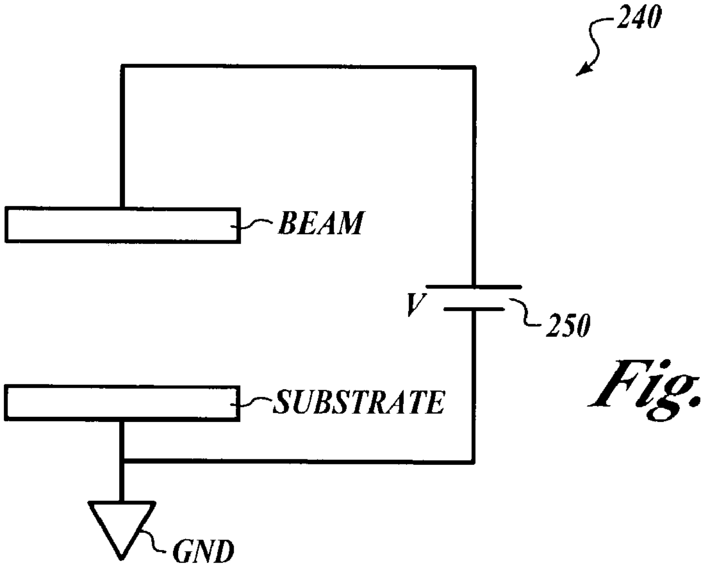
FIG. 6 illustrates a circuit for controlling set point and hysterisis of the thermal switch as shown in FIGS. 1A, 2, 3, and 5.

FIG. 6 illustrates a control circuit 240. The circuit 240 includes a voltage supply 250 that provides a voltage potential to the beams in any one of the embodiments shown in FIGS. 1A, 2, 3, and 5. The voltage source 250 is adjustable. By adjusting the voltage source 250 (i.e., the voltage potential on the beam), one can adjust an electrostatic force that is created between the beam and the substrate, because the substrate acts as ground. By adjusting the electrostatic force, the set point for each of the switches and the hysteresis can be increased or decreased.

While the preferred embodiment of the invention has been illustrated and described, as noted above, many changes can be made without departing from the spirit and scope of the invention. Accordingly, the scope of the invention is not limited by the disclosure of the preferred embodiment.

The embodiments of the invention in which an exclusive property or privilege is claimed are defined as follows:

1. A thermal FET switch comprising:

a insulating substrate defining a channel, the channel divided into a source well, a drain well, and a connecting electron transport channel; and a beam isolated from the source well, the drain well, and the connecting electron transport channel, the beam having each of a first and a second end, the first and second end being attached to the substrate on a first plane, the beam being positioned over the connecting electron transport channel on a second plane, and overlying the source well and the drain well by a lap the beam being configured to receive an electrical charge, wherein the second plane is closer to the source and the drain than the first plane during both an off and an on mode of switch operation.

2. The switch of claim 1, wherein the beam includes a metal cladding the beam having a thermal set point, when the thermal set point is reached, the beam electrically connects the source to the drain.

3. The switch of claim 2, further comprising a voltage source for applying a voltage potential to the metal cladding.

4. The switch of claim 3, wherein the voltage source is adjusted in order to attain an electrostatic force between the metal cladding and the substrate, thereby adjusting one or more of a thermal set point for the switch or hysterisis of the switch.

5. The switch of claim 1, wherein the beam includes an h-beam.

6. A thermal switch comprising:

a substrate defining a source well and a drain well separated by a predefined gap and further defining an electron transport channel communicating with each of the source well and the drain well; and a gate isolated from the substrate and positioned over the source well and the drain well on a first plane, the gate having a first and a second end, each of the first and the second ends being attached to the substrate on a second plane, the gate being configured to selectively allow current to flow between the source well and drain well at a predefined temperature, wherein the, first plane is closer to the source well and the drain well than the second plane during both an off and an on mode of switch operation.

7. The switch of claim 6, wherein the gate includes a beam having a thermal set point, when the thermal set point is reached, the beam moves the gate relative to the source well and the drain well.

8. The switch of claim 7, further comprising a voltage means for applying a voltage potential to the beam.

9. The switch of claim 8, wherein the applied voltage potential is adjusted in order to attain an electrostatic force between the beam and the substrate, thereby adjusting one or more of a thermal set point for the switch or hysterisis of the switch.

10. The switch of claim 7, wherein the beam is an h-beam.

* * * * *